United States Patent
Mehrabi et al.

(10) Patent No.: US 10,447,212 B2
(45) Date of Patent: Oct. 15, 2019

(54) AMPLIFIER WITH NONLINEARITY COMPENSATION

(71) Applicant: QUALCOMM Incorporated, San Diego, CA (US)

(72) Inventors: Arash Mehrabi, San Diego, CA (US); Zongyu Dong, San Jose, CA (US); Vijayakumar Dhanasekaran, San Diego, CA (US); Dongyang Tang, San Diego, CA (US); Chien-Chung Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/986,527

(22) Filed: May 22, 2018

(65) Prior Publication Data

US 2018/0269839 A1 Sep. 20, 2018

Related U.S. Application Data

(62) Division of application No. 15/188,364, filed on Jun. 21, 2016, now Pat. No. 9,998,077.

(Continued)

(51) Int. Cl.
| | |
|---|---|
| *H03F 3/45* | (2006.01) |
| *H03F 1/34* | (2006.01) |
| *H03F 3/183* | (2006.01) |
| *H03F 3/21* | (2006.01) |
| *H03F 1/02* | (2006.01) |
| *H03F 1/32* | (2006.01) |

(52) U.S. Cl.
CPC ............ *H03F 1/34* (2013.01); *H03F 1/0272* (2013.01); *H03F 1/3211* (2013.01); *H03F 3/183* (2013.01); *H03F 3/21* (2013.01); *H03F 3/45475* (2013.01); *H03F 2200/153* (2013.01); *H03F 2200/21* (2013.01); *H03F 2203/45136* (2013.01); *H03F 2203/45151* (2013.01); *H03F 2203/45522* (2013.01); *H03F 2203/45528* (2013.01); *H03F 2203/45562* (2013.01); *H03F 2203/45594* (2013.01)

(58) Field of Classification Search
CPC ........ H03F 1/34; H03F 1/0272; H03F 1/3211; H03F 3/45475; H03F 3/21; H03F 3/183; H03F 2203/45136; H03F 2203/45522; H03F 2203/45594; H03F 2203/45528; H03F 2203/45562; H03F 2200/21; H03F 2203/45151; H03F 2200/153
USPC .................................................. 330/259, 260
See application file for complete search history.

(56) References Cited

U.S. PATENT DOCUMENTS

| | | |
|---|---|---|
| 4,560,946 A | 12/1985 | Yokoyama |
| 6,735,302 B1 | 5/2004 | Caine et al. |

(Continued)

*Primary Examiner* — Khanh V Nguyen
(74) *Attorney, Agent, or Firm* — Qualcomm Incorporated—Toler

(57) ABSTRACT

An apparatus includes a reference voltage circuit having a bandgap input and a reference voltage output. The apparatus also includes a digital-to-analog converter (DAC) coupled to the reference voltage output and having a digital signal input. The apparatus includes an amplifier having a first input coupled to an output of the DAC. The first input is coupled to an output of the amplifier via a feedback resistor. The apparatus includes a resistor coupled to the reference voltage output and having a body terminal coupled to the output of the amplifier.

20 Claims, 7 Drawing Sheets

Related U.S. Application Data

(60) Provisional application No. 62/387,335, filed on Dec. 23, 2015.

(56) References Cited

U.S. PATENT DOCUMENTS

| | | |
|---|---|---|
| 7,756,279 B2 | 7/2010 | Deruginsky et al. |
| 8,081,785 B2 | 12/2011 | Delano et al. |
| 8,441,287 B2 | 5/2013 | Chatterjee et al. |
| 8,680,920 B2 | 3/2014 | Hebert |
| 9,467,100 B2 | 10/2016 | Dhanasekaran |
| 2009/0080276 A1* | 3/2009 | Cai .................... H03K 19/0016 365/212 |
| 2011/0018678 A1 | 1/2011 | Anjalbert |
| 2014/0347130 A1* | 11/2014 | Iijima .................. H03F 1/0261 330/288 |
| 2016/0226451 A1 | 8/2016 | Vigraham et al. |
| 2017/0187336 A1 | 6/2017 | Mehrabi et al. |

* cited by examiner

AMPLIFIER WITH NONLINEARITY COMPENSATION

I. CROSS REFERENCE TO RELATED APPLICATIONS

The present application claims priority from and is a divisional application of pending U.S. Non-Provisional patent application Ser. No. 15/188,364 filed Jun. 21, 2016 and entitled "AMPLIFIER WITH NONLINEARTIY COMPENSATION," which claims priority from commonly owned U.S. Provisional Patent Application No. 62/387,335 filed Dec. 23, 2015 and entitled "AMPLIFIER WITH NONLINEARITY COMPENSATION," the contents of each of which are expressly incorporated herein by reference in their entireties.

II. FIELD

The present disclosure is generally related to electronics, and more specifically to amplifiers with nonlinearity compensation.

III. BACKGROUND

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities and may support increasing wireless communication capability, particularly in downlink communications that provide information to the wireless telephones.

Such computing devices typically include circuitry that may exhibit non-ideal characteristics. For example, resistors, such as polysilicon resistors ("poly-resistors"), exhibit changes in conductivity ("conductivity modulation") based on an amount of applied voltage. A poly-resistor may be formed of a resistive strip over a semiconductor substrate, such as over a doped region or "well" in the substrate. The poly-resistor may be formed on a dielectric layer that electrically isolates the resistive strip from the substrate. Applying a voltage across the poly-resistor (e.g., by applying different voltages to a first terminal coupled to a first end of the resistive strip and a second terminal coupled to a second end of the resistive strip) induces current through the poly-resistor. The induced current may be approximated as V=IR according to Ohm's Law, where V is the voltage across the poly-resistor, I is the current through the poly-resistor, and R is the resistance of the poly-resistor. Although Ohm's Law may provide a satisfactory approximation of the induced current under conditions in which the resistance of the resistor is approximately constant, under other conditions the approximation of V=IR may be unsatisfactory, such as for a resistor having a resistance that varies based on the voltage applied across the resistor.

Applying the voltage V across the poly-resistor also causes charge accumulation in the poly-resistor and charge depletion in the substrate (or charge accumulation in the substrate and charge depletion in the poly-resistor, depending on the voltage). The charge accumulation on one side of the dielectric layer and charge depletion on the other side of the dielectric layer results in a parasitic capacitance between the resistive strip and the substrate. This parasitic capacitance affects the conductivity, and therefore the resistance, of the resistive strip. As another example, when a conductive element, referred to as a "shield," is positioned above a top surface of the resistor, applying a voltage across the terminals of the resistor may also result in a parasitic capacitance between the shield and the resistor.

Changes in the conductivity of a resistor cause the resistor's current-voltage characteristic to be non-linear (e.g., the resistor has a resistance that changes as a function of voltage applied across the resistor). When such resistors are used as feedback resistors of an amplifier, the conductivity modulation introduces distortion at the amplifier's output. For example, conductivity modulation at a resistor coupled to a headphone power amplifier degrades the quality of an audio signal output of the headphone power amplifier.

IV. BRIEF DESCRIPTION OF THE DRAWINGS

V. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. As used herein, "coupled," along with its derivatives, may mean one or more of the following. "Coupled" may mean a direct physical or electrical coupling or connection, where there is no other element coupled or connected between the elements that are said to be coupled with each other. "Coupled" may also mean an indirect physical or electrical coupling or connection, where one or more other elements are coupled or connected between the elements that are said to be coupled with each other.

Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
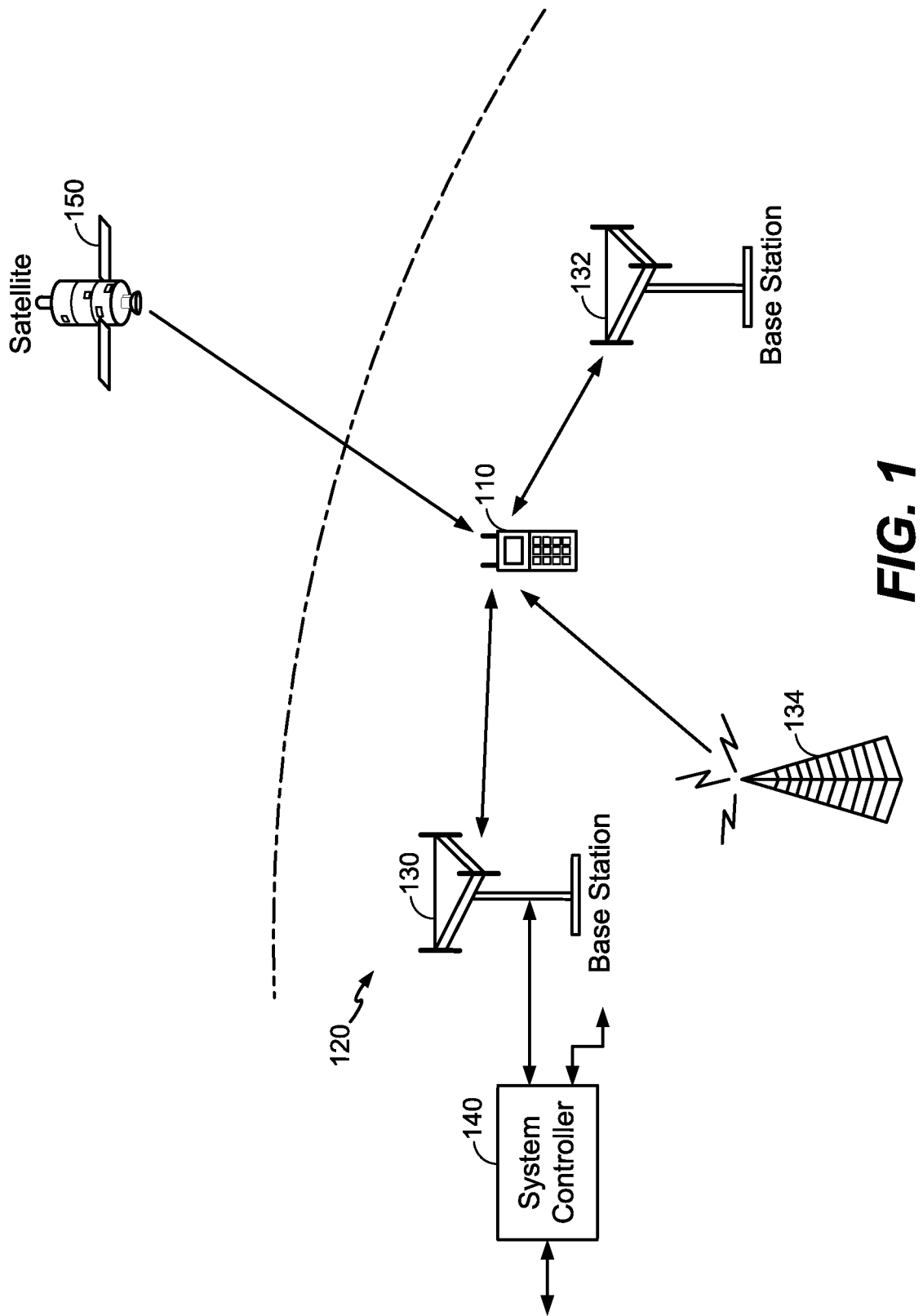
FIG. 1 shows a wireless device that includes an amplifier with nonlinearity compensation, the wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth® device (Bluetooth® is a registered trademark of Bluetooth SIG, Inc.), etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication, such as LTE, WCDMA, CDMA 1×, EVDO, TD-SCDMA, GSM, 802.11, etc.

Further, in an exemplary embodiment, the wireless device 110 includes an amplifier circuit with nonlinearity compensation. For example, the wireless device 110 may include a bias circuit that is configured to supply a bias voltage to a body terminal of a feedback resistor. For example, the body terminal may be coupled to a well (or other doped region or substrate) under the feedback resistor or to a shield over the feedback resistor. The bias voltage may be generated based on an output of the amplifier circuit and may be configured to at least partially cancel or offset conductivity modulation of the feedback resistor, reducing distortion of the amplifier circuit. Examples of amplifier circuits with nonlinearity compensation are described with respect to FIGS. 2-6.

Figure 2:
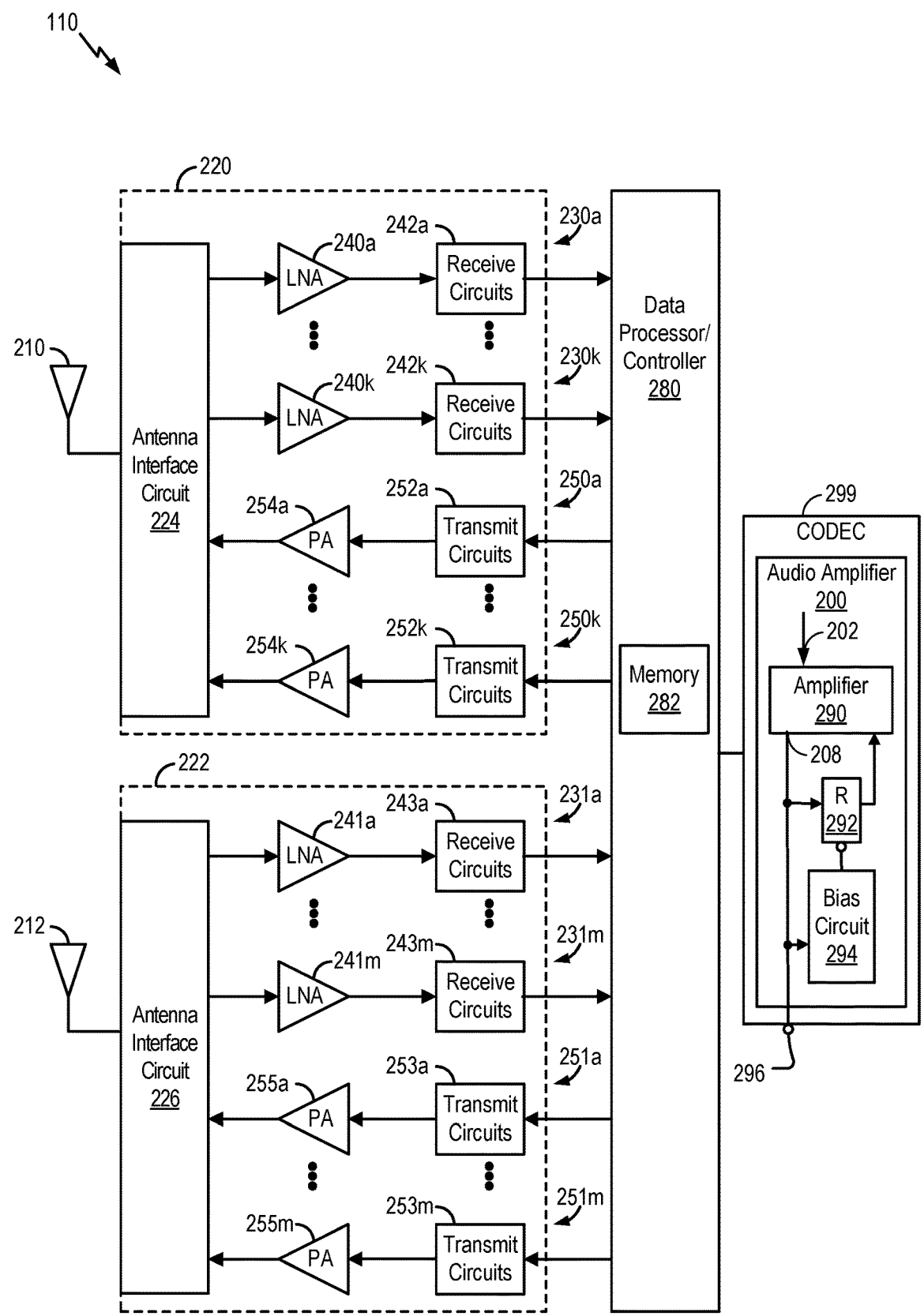
FIG. 2 is a block diagram that illustrates components of the wireless device in FIG. 1.
Figure 5:
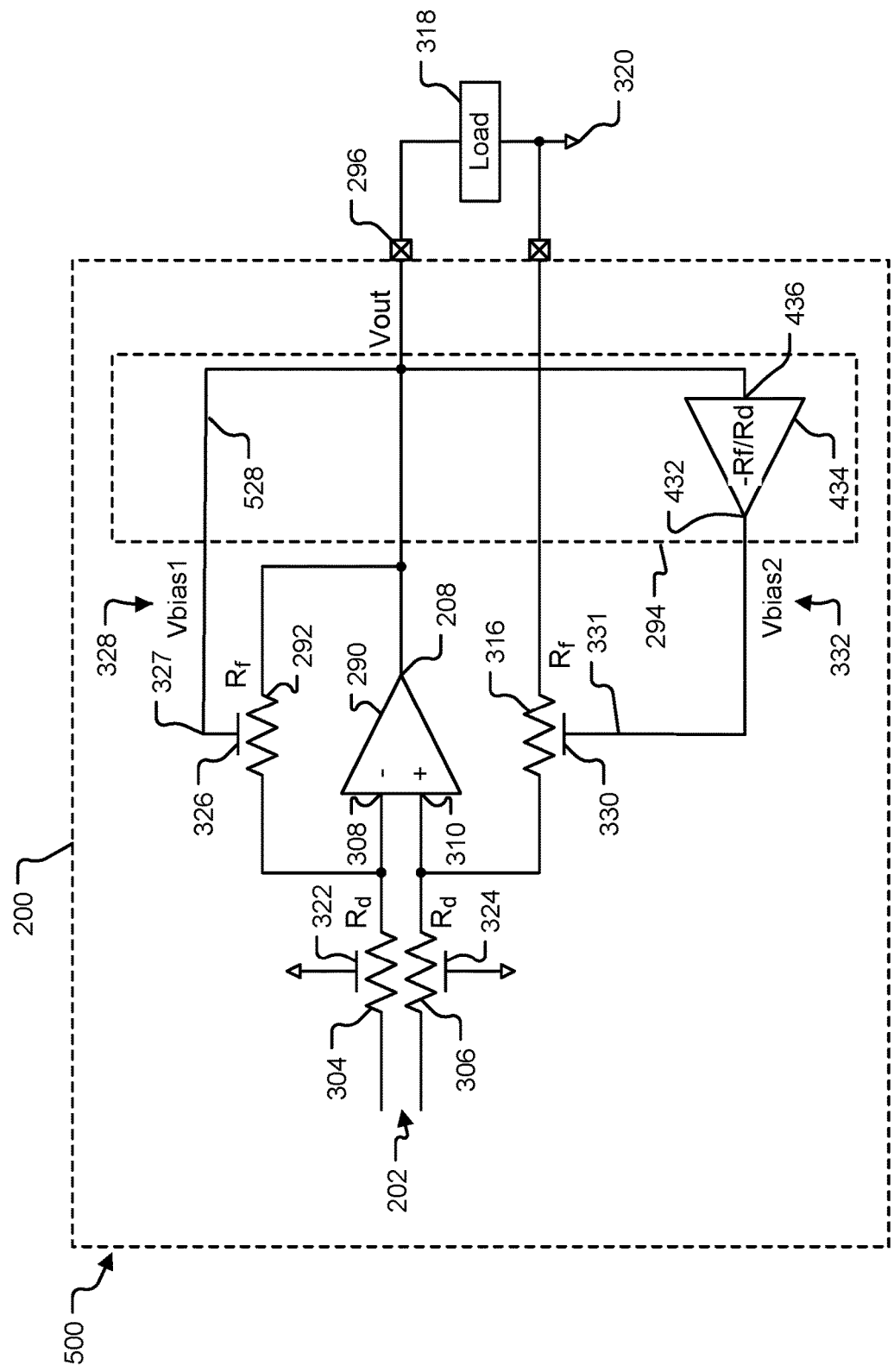
FIG. 5 is a block diagram of another exemplary embodiment of components including an amplifier with nonlinearity compensation that may be included in the wireless device of FIG. 1.
Figure 6:
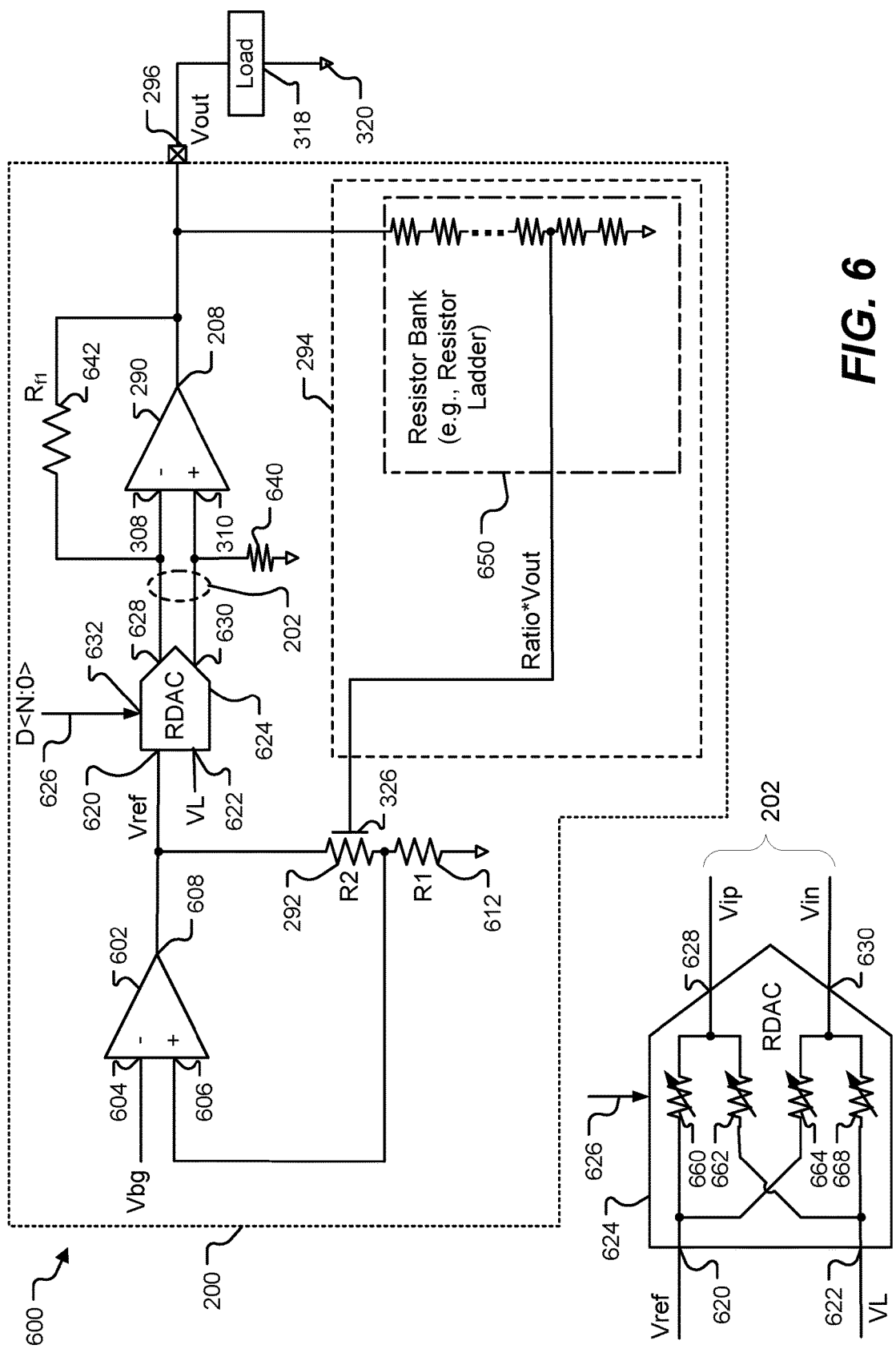
FIG. 6 is a block diagram of another exemplary embodiment of components including an amplifier with nonlinearity compensation that may be included in the wireless device of FIG. 1.

FIG. 2 shows a block diagram of an exemplary design of the wireless device 110 in FIG. 1. In this exemplary design, wireless device 110 includes an audio amplifier 200 that includes a bias circuit 294. The bias circuit 294 is configured to bias a body terminal of a feedback resistor 292 based on an output of an amplifier 290, such as described in further detail with reference to FIG. 3. The feedback resistor 292 is coupled to the amplifier 290 (e.g., directly coupled as illustrated in FIG. 5 or coupled via one or more other components, such as coupled via a digital-to-analog converter (DAC) as illustrated in FIG. 6). The audio amplifier 200 is included in a coder/decoder (CODEC) 299 that is coupled to a data processor/controller 280. The wireless device 110 also includes a transceiver 220 coupled to the data processor/controller 280 and a transceiver 222 coupled to the data processor/controller 280. The transceiver 220 is coupled to a primary antenna 210 via an antenna interface circuit 224, and the transceiver 222 is coupled to a secondary antenna 212 via an antenna interface circuit 226.

Transceiver 220 includes multiple (K) receivers 230a to 230k and multiple (K) transmitters 250a to 250k to support multiple frequency bands, multiple radio technologies, carrier aggregation, etc. Transceiver 222 includes multiple (M) receivers 231a to 231m and multiple (M) transmitters 251a to 251m to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230a to 230k and 231a to 231m includes one of the LNAs 240a to 240k or 241a to 241m that is configured to provide an RF signal to one of the receive circuits 242a to 242k or 243a to 243m. For data reception, the primary antenna 210 receives signals from base stations and/or other transmitter stations and provides a received RF signal, which is routed through the antenna interface circuit 224. Antenna interface circuit 224 may include switches, duplexers, transmit filters, receive filters, matching circuits, etc. An output of the antenna interface circuit 224 is presented as an input RF signal to one or more of the receivers 230a to 230k, such as via a first input signal path to receiver 230a or via a second input signal path to receiver 230k. Within the one or more of the receivers 230a to 230k, the input RF signal is amplified and provided to the respective one or more receive circuits 242a to 242k.

The description below assumes that receiver 230a is selected to receive an RF signal. The RF signal is received from the antenna 210 via the antenna interface circuit 224 and is provided to the LNA 240a. An amplified RF signal is generated by the LNA 240a. Receive circuits 242a downconvert the amplified RF signal, amplify and filter the downconverted signal, and provide an analog input signal to data processor/controller 280. Receive circuits 242a may include mixers, filters, amplifiers, matching circuits, an oscillator, a local oscillator (LO) generator, a phase locked loop (PLL), etc. For example, the RF signal may encode music data to be stored at a memory 282 of the data processor/controller 280.

In the exemplary design shown in FIG. 2, each of the transmitters 250a to 250k and 251a to 251m includes one of the transmit circuits 252a to 252k and 253a to 253m and one of the power amplifiers (PAs) 254a to 254k and 255a to 255m. For data transmission, data processor/controller 280 processes (e.g., encodes and modulates) data to be transmitted and provides an analog output signal to a selected transmitter. The description below assumes that transmitter 250a is the selected transmitter to transmit a RF signal.

Within transmitter 250a, transmit circuits 252a amplify, filter, and upconvert the analog output signal from baseband to RF and provide a modulated RF signal. Transmit circuits 252a may include amplifiers, filters, mixers, matching circuits, an oscillator, an LO generator, a PLL, etc. A PA 254a receives and amplifies the modulated RF signal and provides a transmit RF signal having the proper output power level. The transmit RF signal is routed through antenna interface circuit 224 and transmitted via antenna 210. Each of the transmitters 250a to 250k and 251a to 251m in transceivers 220 and 222 may operate in a similar manner as transmitter 250a.

FIG. 2 shows an exemplary design of receivers 230a to 230k and 231a to 231m and transmitters 250a to 250k and 251a to 251m. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240a to 240k and 241a to 241m and receive circuits 242a to 242k and 243a to 243m may be implemented on one module, which may be an RFIC, etc.

Data processor/controller 280 may perform various functions for wireless device 110. For example, data processor/controller 280 may perform processing for data received via receivers 230a to 230k and 231a to 231m and data to be transmitted via transmitters 250a to 250k and 251a to 251m. For example, the data processor/controller 280 may be configured to process received data to recover music data of a received RF signal and may store the music data in an audio file in the memory 282. Data processor/controller 280 may control the operation of the various circuits within transceivers 220 and 222. The memory 282 may store program code and data for data processor/controller 280. Data processor/controller 280 may be implemented on one or more application specific integrated circuits (ASICs) and/or other ICs.

The CODEC 299 is coupled to the data processor/controller 280, and the CODEC 299 includes the audio amplifier 200 (e.g., a single-ended power amplifier, such as a headphone amplifier) coupled to an output 296, such as an amplifier output port. The CODEC 299 may be configured to receive a digital audio signal from the data processor/controller 280 and to convert the digital audio signal into an analog audio signal 202. For example, the digital audio signal may correspond to music data from an audio file that is processed by the data processor/controller 280. The audio amplifier 200 may be configured to connect to one or more headphones or external speakers via the output 296, and the analog audio signal 202 may be output to the audio amplifier 200 to power headphones or other external speakers that are coupled to the output 296, enabling playback of the audio file via the headphones or other external speakers.

In some implementations, the audio amplifier 200 includes an amplifier circuit that includes a first feedback resistor (e.g., the feedback resistor 292) and a second feedback resistor. The first feedback resistor has a first body terminal at a first bias and the second feedback resistor has a second body terminal at a second bias that is different from the first bias. In some implementations, the bias circuit 294 may couple the first body terminal to an output 208 of the amplifier 290 via a first amplifier (e.g., an amplifier with positive gain or unitary gain) and may couple the second body terminal to the output of the amplifier 290 via a second amplifier (e.g., an amplifier with negative gain), such as described with reference to FIG. 4. In other implementations, the bias circuit 294 may couple the first body terminal to an output 208 of the amplifier 290 via a loopback connection (e.g., a direct connection, such as described with reference to FIG. 5) and may couple the second body terminal to the output of the amplifier 290 via a second amplifier (e.g., an amplifier with a negative gain). Implementations that include a loopback connection to the first body terminal may have reduced circuit area and power consumption as compared to implementations that couple the first body terminal to the output 208 via an amplifier. The first feedback resistor may have a first conductive modulation that is at least partially offset by a second conductive modulation of the second feedback resistor to reduce total harmonic distortion of the amplifier 290. Examples of the amplifier circuit with the first and second biased feedback resistors are described in further detail with respect to FIGS. 3-5.

In other implementations, the amplifier circuit may include the feedback resistor 292 in a feedback loop of a reference voltage generation circuit. Biasing the body terminal of the feedback resistor 292 in the feedback loop of the reference voltage generation circuit generates "pre-distortion" of the reference signal. The pre-distortion of the reference signal results in pre-distortion of the analog signal 202 that at least partially offsets distortion caused by conductivity modulation of one or more other resistors of the amplifier 290. An example of the amplifier circuit configured to generate pre-distortion of the reference signal is described in further detail with respect to FIG. 6.

Although the first feedback resistor is described as having a "first body terminal" and the second feedback resistor is described as having a "second body terminal," such naming convention does not require or limit either of first feedback resistor or the second feedback resistor to have multiple body terminals. In some embodiments, the first feedback resistor has a single body terminal and the second feedback resistor has a single body terminal. For example, as illustrated in FIG. 3 and described in further detail below, a first feedback resistor 292 may have a single body terminal (first body terminal 326) and a second feedback resistor 316 a have a single body terminal (second body terminal 330).

Figure 3:
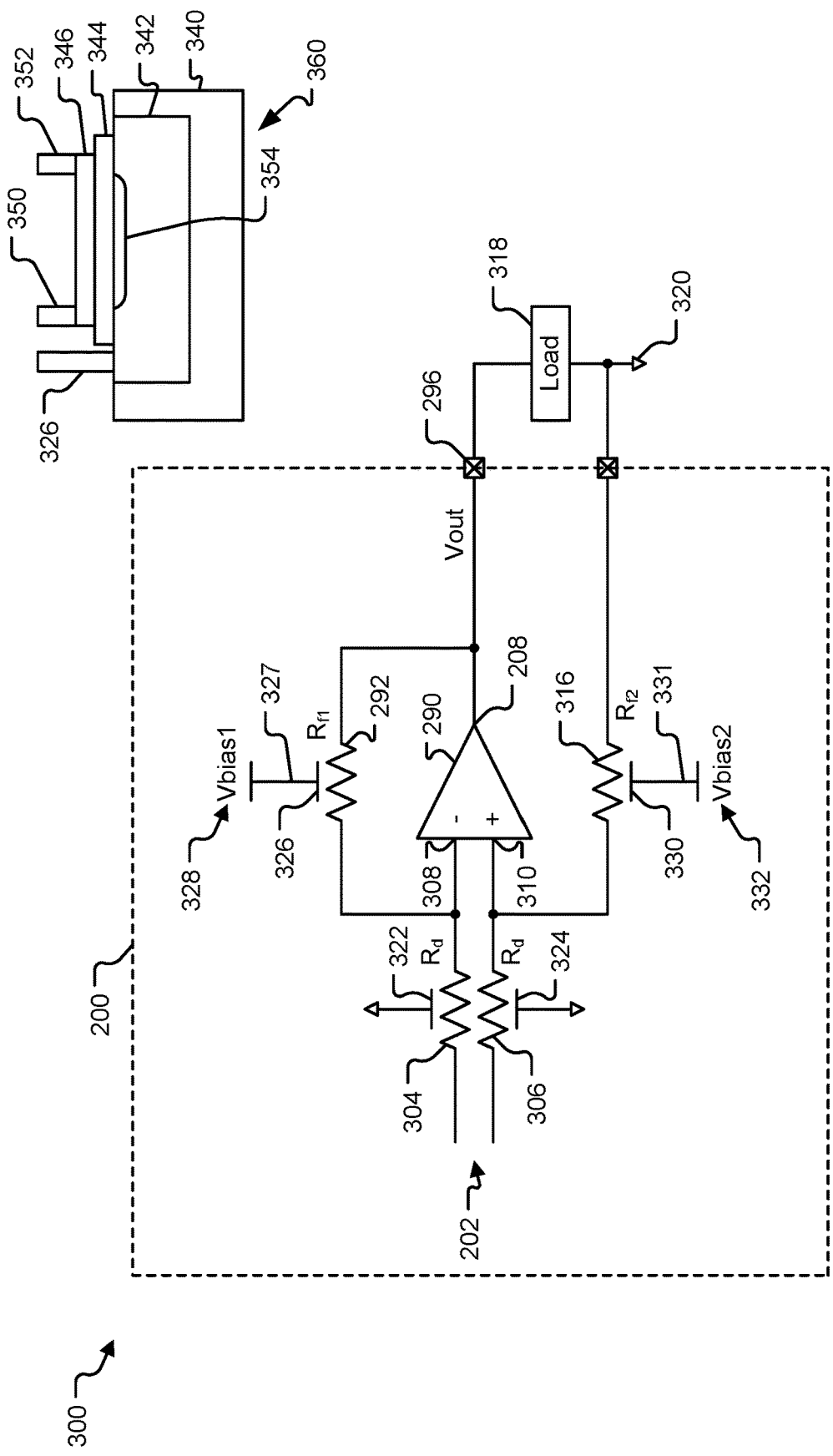
FIG. 3 is a block diagram of an exemplary embodiment of components including an amplifier with nonlinearity compensation that may be included in the wireless device of FIG. 1.

FIG. 3 illustrates an exemplary embodiment of an amplifier circuit 300, such as circuitry that includes a power amplifier (e.g., a headphone power amplifier). As illustrated, the amplifier circuit 300 may correspond to the audio amplifier 200 of FIG. 2 and may include the amplifier 290 of FIG. 2. The amplifier 290 has a first input 308 and a second input 310. A first input resistor 304 is coupled to the first input 308 and the first input resistor 304 has a body terminal 322. A second input resistor 306 is coupled to the second input 310 and the second input resistor 306 has a body terminal 324. The feedback resistor 292 (a first feedback resistor) is coupled to the first input 308 and to the output 208 of the amplifier 290. The first feedback resistor 292 has a first body terminal 326 coupled to a first bias terminal 327. A second feedback resistor 316 is coupled to the second input 310 and to ground 320. The second feedback resistor 316 has a second body terminal 330 coupled to a second bias terminal 331. A load 318 may be coupled to the output 296 and to ground 320.

A cross-sectional view 360 illustrates a portion of the circuit 300 that includes the first feedback resistor 292. A substrate 340 includes a well 342, such as an n-well or a p-well. An insulating layer 344, such as a dielectric or oxide material, electrically insulates a resistive material 346 (e.g., a polysilicon strip) from a surface of the well 342. A first contact 350 and a second contact 352 are coupled to the resistive material 346. The first contact 350 may also be coupled to the first input 308 of the amplifier 290, and the second contact 352 may also be coupled to the output 208 of the amplifier 290. The first body terminal 326 of the resistor 292 is coupled to the well 342 (e.g., in contact with a surface of the well 342) and enables biasing of the well 342 via the first bias terminal 327.

A charge carrier depletion or accumulation 354 may be induced near the surface of the well 342 based on a voltage applied across the resistive material 346 via the contacts 350, 352. The charge carrier depletion or accumulation 354 introduces parasitic capacitance that affects conductivity of the first feedback resistor 292. Applying a bias voltage to the well 342 via the first body terminal 326 affects (e.g., increases or decreases) the charge carrier depletion or accumulation 354, the parasitic capacitance resulting from the charge carrier depletion or accumulation 354, and the resulting conductive modulation of the first feedback resistor 292. The second feedback resistor 316 may have a similar structure and may operate in a similar manner as the first feedback resistor 292.

The amplifier circuit 300 may convert a differential input signal (the analog signal 202) received at the input resistors 304, 306 to a single-ended output signal that is applied to the load 318. The first body terminal 326 may be biased at a first bias voltage (Vbias1) 328 and the second body terminal 330 may be biased at a second bias voltage (Vbias2) 332 that may be different than Vbias1 328. Vbias1 328 and Vbias2 332 may be generated by the bias circuit 294 of FIG. 2, such as described in further detail with respect to the exemplary embodiments of FIG. 4 and FIG. 5. Due to the differential nature of the input signal 202, an effect of conductive modulation of the first input resistor 304 may substantially cancel an effect of conductive modulation of the second input resistor 306 when the body terminals 322, 324 are coupled to ground. In addition, Vbias1 328 and Vbias2 332 may be set to voltages that cause a first conductive modulation of the first feedback resistor 292 to be at least partially offset by a second conductive modulation of the second feedback resistor 316, as described below with reference to Equations 1-3. Partially offsetting or cancelling the conductive modulation of the resistors 304, 306, 292, and 316 reduces the total harmonic distortion (THD) of the amplifier circuit 300, improving the quality of the signal at the output 296 that may be applied to the load 118.

Figure 4:
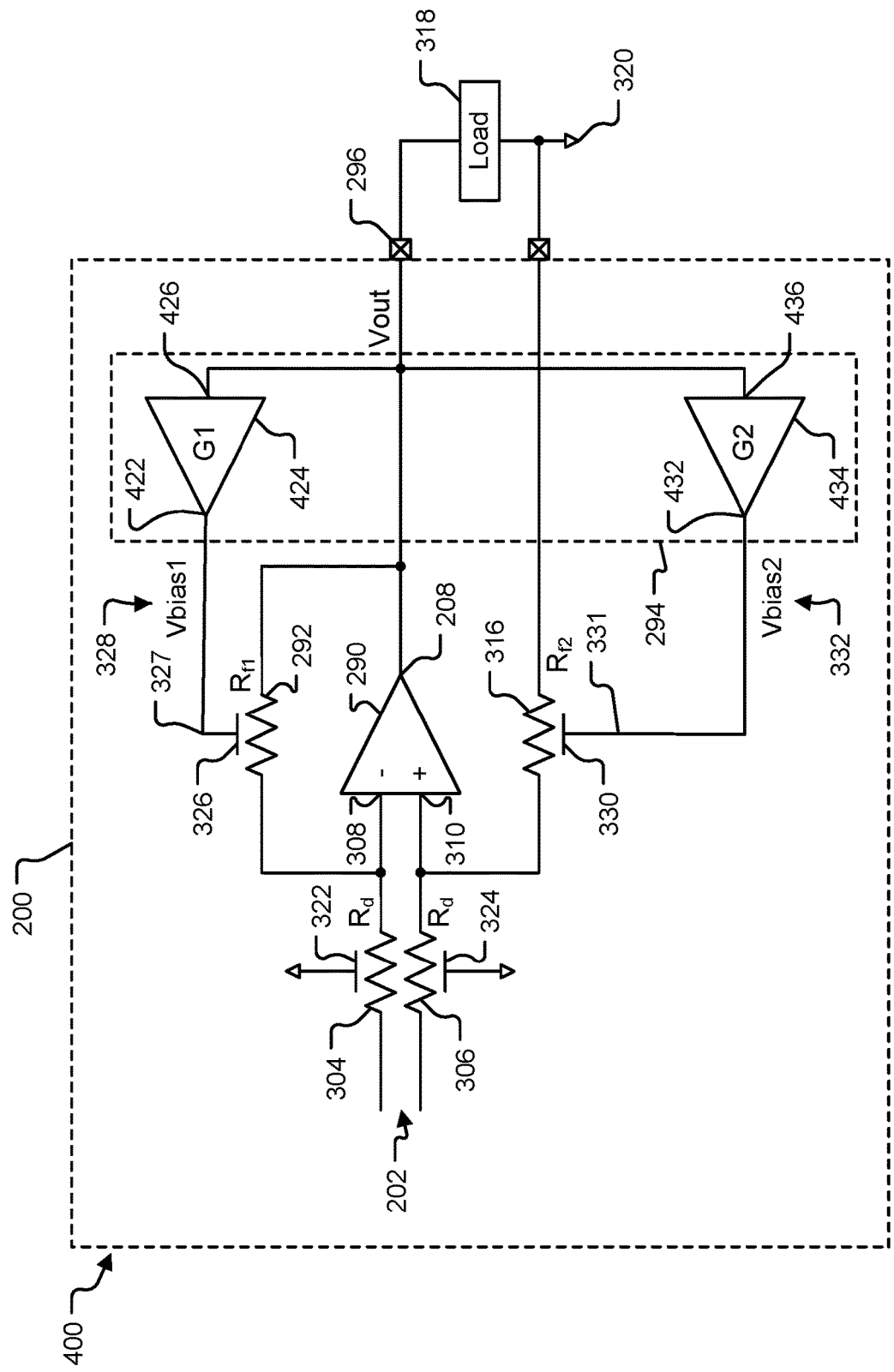
FIG. 4 is a block diagram of another exemplary embodiment of components including an amplifier with nonlinearity compensation that may be included in the wireless device of FIG. 1.

FIG. 4 illustrates another exemplary embodiment of an amplifier circuit 400 that may correspond to the audio amplifier 200 of FIG. 2 and that includes the amplifier 290 and the resistors 304, 306, 292, and 316 of FIG. 3. In this example, the bias circuit 294 of FIG. 2 couples the first bias terminal 327 to the output 208 of the first amplifier 290 via a feedback amplifier 424 and couples the second bias terminal 331 to the output 208 of the first amplifier 290 via a feedback amplifier 434.

The feedback amplifier 424 has an input 426 coupled to the output 208 of the amplifier 290. An output 422 of the feedback amplifier 424 is coupled to the first bias terminal 327. The feedback amplifier 424 is configured to generate Vbias1 328 by applying a first gain G1 to the output signal Vout that is received at the input 426 of the feedback amplifier 424.

The feedback amplifier 434 has an input 436 coupled to the output 208 of the amplifier 290. An output 432 of the feedback amplifier 434 is coupled to the second bias terminal 331. The feedback amplifier 434 is configured to generate Vbias2 332 by applying a second gain G2 to the output signal Vout that is received at the input 436 of the feedback amplifier 434.

The gains G1 and G2 may be selected so that distortion at the amplifier 290 due to conductivity modulation of the first feedback resistor 292 is substantially cancelled by distortion due to conductivity modulation of the second feedback resistor 316. In a particular aspect, conductivity modulation of the first feedback resistor 292 is proportional to the difference between Vbias1 328 and an average voltage across the first feedback resistor 292, and conductivity modulation of the second feedback resistor 316 is proportional to the difference between Vbias2 332 and an average voltage across the second feedback resistor 316. Due to the differential nature of the input signal 202, the average voltage across the first feedback resistor 292 may have opposite polarity to the average voltage across the second feedback resistor 316. Thus, the bias voltage Vbias1 328 may have opposite polarity as compared to Vbias2 332 (e.g., G1 and G2 may have opposite signs) to substantially cancel the respective distortions at the amplifier 290. Also, because the effect of changes in resistance of the first feedback resistor 292 on Vout may be larger as compared to the effect on Vout of equivalent changes in resistance of the second feedback resistor 316, magnitudes of G1 and G2 may be independently adjusted to substantially cancel the respective distortions at the amplifier 290. For example, because gain of the amplifier 290 may be at least partially based on the ratio of feedback resistance to input resistance (e.g., $R_{f1}/R_d$), the ratio of the magnitudes of G1 and G2 may also be at least partially based on the ratio of feedback resistance to input resistance (e.g., $R_{f1}/R_d$). Values of G1 and G2 may be determined empirically, may be determined based on one or more theoretical models, may be determined based on one or more simulations, or a combination thereof.

The analysis below with reference to Equations 1-8 is provided to explain and demonstrate the operation of a particular embodiment. The analytical models are approximate and are provided solely for explanation of a particular mode of operation of an embodiment. Other models or approximation may also be used to explain a particular embodiment.

A model that approximates Vout as a function on an input voltage Vin is provided in Equation 1.

$$V_{out} = V_{in} \left\{ \frac{2R_f}{R_d} + \frac{2\Delta R_m}{R_d} - \frac{\Delta R_m - \Delta R_g}{R_f + R_d + \Delta R_g} \right\} \quad \text{(Eq. 1)}$$

In Equation 1, $R_f$ and $R_d$ are resistances of feedback and input resistors, respectively, and $\Delta R_m$ and $\Delta R_g$ are the changes in resistance of the feedback resistors (signal and ground side, respectively) due to conductivity modulation. Equation 2 depicts a condition to remove the error term from Equation 1, $$\Delta R_g = -\Delta R_m \left( \frac{2R_f}{R_d} + 1 \right) \quad \text{(Eq. 2)}$$

Denoting $A=R_f/R_d$ and $V_{sm}$ and $V_{sg}$ as the substrate voltages of the signal and ground side feedback resistors, respectively, gives:

$$\Delta R_m \propto \left(\frac{A}{1+A} + 2A\right)V_{in} - 2V_{sm} \quad \text{(Eq. 3a)}$$

and $$\Delta R_g \propto \left(\frac{A}{1+A}\right)V_{in} - 2V_{sg}. \quad \text{(Eq. 3b)}$$

Equations 2, 3a, and 3b result in:

$$\left(\frac{A}{1+A}\right)V_{in} - 2V_{sg} = -(2A+1)\left(\left(\frac{A}{1+A} + 2A\right)V_{in} - 2V_{sm}\right) \quad \text{(Eq. 4)}$$

which simplifies to:

$$V_{sg} = -(1+2A)V_{sm} + (1+A)V_{out}. \quad \text{(Eq. 5)}$$

When the resistance ($R_{f1}$) of the first feedback resistor 292 matches the resistance ($R_{f2}$) of the second feedback resistor 316 (e.g., $R_{f1}=R_{f2}=R_f$) and the resistance ($R_d$) of the first input resistor 304 matches the resistance ($R_d$) of the second input resistor 306, resistor nonlinearity may be cancelled based on Equation 6.

$$V_{sg} = -\left(1 + 2\frac{Rf}{Rd}\right)V_{sm} + \left(1 + \frac{Rf}{Rd}\right)V_{out}. \quad \text{(Eq. 6)}$$

In Equation 6, $V_{sg}$ corresponds to the bias voltage applied to the body terminal 330 of the second feedback resistor 316 (e.g., Vbias2 332, which equals G2*Vout) and $V_{sm}$ corresponds to the bias voltage applied to the body terminal 326 of the first feedback resistor 292 (e.g., Vbias1 328, which equals G1*Vout). When $R_f=R_d$, Equation 6 simplifies to:

$$V_{sg} = 2V_{out} - 3V_{sm}. \quad \text{(Eq. 7)}$$

From Equation 7, if G1 is set to 1, $V_{sm}$=Vout, and $V_{sg}$=-Vout, indicating that G2=-1. Therefore, resistor nonlinearity is cancelled when $R_{f1}=R_{f2}=R_d$, G1=1, and G2=-1. In this example, the feedback amplifier 424 may be a buffer (i.e., G1=1) or may be replaced by a connection (e.g., a wire or loopback path, as described with respect to FIG. 5), and the feedback amplifier 434 may be an inverting buffer or an inverting connection, such as an inverter (i.e., G2=-1). Although the above examples describe a buffer as a device that provides unitary gain (e.g., gain of 1 or -1), a buffer may include any device that provides electrical impedance transformation from one circuit to another, such as a unity-gain amplifier (e.g., emitter follower, source follower) or a non-unity gain amplifier as illustrative, non-limiting examples.

Alternatively, when $R_f$ is different from $R_d$ and $V_{sm}$=Vout, Equation 6 simplifies to:

$$V_{sg} = -\frac{Rf}{Rd}V_{out}. \quad \text{(Eq. 8)}$$

Equation 8 provides an example where resistor nonlinearity is cancelled when $R_{f1}=R_{f2}$, G1=1, and G2=-($R_f/R_d$), such as described in further detail with respect to FIG. 5.

FIG. 5 illustrates an exemplary embodiment of an amplifier circuit 500 that may correspond to the audio amplifier 200 of FIG. 2 and that includes the amplifier 290 (e.g., a "first amplifier 290") and the resistors 304, 306, 292, and 316 of FIG. 3. In this example, the bias circuit 294 of FIG. 2 couples the first bias terminal 327 to the output 208 of the first amplifier 290 via a loopback path 528. For example, the loopback path 528 may include a connection of the first body terminal 326 to the output 208 or may include a buffer having an input coupled to the output 208 of the amplifier 290 and having an output coupled to the first bias terminal 327, such as the feedback amplifier 424 of FIG. 4 with G1=1.

The bias circuit 294 also couples the second bias terminal 331 to the output 432 of the feedback amplifier 434 of FIG. 4 (e.g., a "second amplifier 434"). The second amplifier 434 has the input 436 coupled to the output 208 of the first amplifier 290. The second amplifier 434 may be configured to have a negative gain. For example, in an implementation where each feedback resistor 292, 316 has a resistance $R_f$ and each input resistor 304, 306 has a resistance $R_d$, the gain of the second amplifier 434 may be set as $-R_f/R_d$.

Although FIG. 5 illustrates a loopback connection 528 for the first body terminal 326 and also includes the second amplifier 434 to bias the second body terminal 330, in other implementations other biasing mechanisms may be used to at least partially offset conductive modulation of the resistors 292, 316. For example, although the exemplary embodiments of FIGS. 4-5 are described with reference to simplifying conditions of Equation 6 (e.g., regarding resistances and gain values) that result in Equation 7 and Equation 8, it should be understood that other configurations may be used that satisfy Equation 6 and that may not be constrained by such simplifying conditions.

The exemplary embodiments of FIGS. 3-5 reduce amplifier distortion caused by conductivity modulation of the feedback resistors 292, 316 by biasing body terminals of the feedback resistors 292, 316. The bias applied to the body terminal of each of the feedback resistors 292, 316 causes the effect of conductive nonlinearity of one of the feedback resistors 292, 316 to substantially cancel the effect of conductive nonlinearity of the other of the feedback resistors 292, 316 on the output of the amplifier 290. An alternative mechanism to compensate for effects of conductive nonlinearity of the amplifier 290 is described with respect to the exemplary embodiment of FIG. 6, where a body bias is applied to introduce pre-distortion into the input analog signal 202.

FIG. 6 illustrates an exemplary embodiment of an amplifier circuit 600 that may correspond to the audio amplifier 200 of FIG. 2. The amplifier circuit 600 includes a reference voltage circuit 602 (e.g., an operational amplifier (opamp)) coupled to a digital-to-analog converter (DAC) 624. The DAC 624 provides the input signal 202 to the amplifier 290. The output 208 of the amplifier 290 may be coupled to the load 318 via the output 296. In contrast to FIGS. 3-5, the feedback resistor 292 that receives a body bias is coupled to the reference voltage circuit 602 to generate pre-distortion of a reference voltage (Vref). The pre-distortion of Vref at least partially compensates for distortion caused by a feedback resistor 642 of the amplifier 290.

The reference voltage circuit 602 may include an amplifier having a bandgap input 604 and a feedback input 606. The feedback input 606 is coupled to an output of a voltage divider that includes the feedback resistor 292 and a bias resistor 612. The voltage divider is responsive to a reference voltage output 608 of the reference voltage circuit 602. The reference voltage circuit 602 may be configured to receive a bandgap voltage (Vbg) that may be generated by a bandgap voltage generation circuit to be substantially independent of process, voltage, and temperature (PVT) variations. The reference voltage circuit 602 may generate a reference voltage Vref that corresponds to the bandgap voltage after being amplified based on the first resistance R1 of the bias resistor 612 and the second resistance R2 of the feedback resistor 292.

The DAC 624 has a "high" reference input 620 coupled to the reference voltage output 608 and a "low" reference input 622 coupled to another reference voltage VL (e.g., ground or −Vref). The DAC 624 is configured to generate the input signal 202 as a differential signal at a first differential output 628 and a second differential output 630. The differential signal is generated responsive to a digital signal 626 received at a digital signal input 632 of the DAC 624.

For example, the DAC 624 may be implemented as a resistive DAC (RDAC) 624 as illustrated in the exploded view of the DAC 624 depicted in FIG. 6. A first voltage divider that includes a resistor 660 and a resistor 662 is serially coupled between the high reference input 620 and the low reference input 622. A second voltage divider that includes a resistor 664 and a resistor 668 is serially coupled between the high reference input 620 and the low reference input 622. The first differential output 628 may be coupled to an output of the first voltage divider. The second differential output 630 may be coupled to an output of a second voltage divider. The resistors 660-668 may have adjustable resistances that are responsive to the digital signal 626 to generate a "positive" input voltage signal (Vip) at the first differential output 628 and a "negative" input voltage signal (Vin) at the second differential output 630. For example, the digital signal 626 may include N+1 bits (including bits N, N−1, . . . , 1, 0) that are coupled to control inputs of each of the adjustable resistors 660-668 to adjust an amount of resistance of each of the resistors 660-668 based on the value of each of the bits of the digital signal 626.

The amplifier 290 receives the input signal 202 from the DAC 624. The first input 308 of the amplifier 290 may be coupled to the first differential output 628 of the DAC 624 and may be coupled to the output 208 of the amplifier 290 via the feedback resistor 642. The second input 310 of the amplifier 290 may be coupled to the second differential output 630 of the DAC 624 and may be coupled to ground via a resistor 640. The output 208 of the amplifier 290 may be a single-ended output that generates an output signal (Vout) that is applied to the load 318 via the output 296.

The bias circuit 294 includes a voltage divider 650 coupled to the output 208 of the amplifier 290. The voltage divider 650 is configured to generate a bias signal corresponding to a scaled version of Vout. The voltage divider 650 is illustrated as including a resistor bank or ladder of serially coupled resistors, and the output of the voltage divider 650 generates a bias signal having a value of (Ratio)*(Vout), where Ratio corresponds to a scaling factor applied to Vout. In some implementations, the value of Ratio may be adjustable. For example, individual nodes between resistors of the voltage divider 650 may be selectably coupled to the output of the voltage divider 650 (e.g., via a multiplexer having inputs coupled to multiple nodes in the voltage divider 650). The output of the voltage divider 650 is coupled to the body terminal 326 of the feedback resistor 292. In some implementations, the voltage divider 650 is configured to provide a particular value of Ratio and may not be adjustable. In other implementations where the voltage divider 650 is adjustable, a node of the voltage divider 650 may be selected to configure the voltage divider 650 to provide a selected value of Ratio, such as described with reference to Equation 5, below.

The value of Ratio may be selected to reduce a distortion metric of the amplifier 290, such as the ratio of the root-mean-square (rms) level of a second-order harmonic to the rms level of the signal. The ratio of the rms level of a second-order harmonic to the rms level of the signal is referred to as second-harmonic distortion (HD2). A value of Ratio may be determined empirically, may be determined based on one or more theoretical models, may be determined based on one or more simulations, or a combination thereof.

The analysis below with reference to Equations 9 and 10 is provided to explain and demonstrate the operation of a particular embodiment. The analytical models are approximate and are provided solely for explanation of a particular mode of operation of an embodiment. Other models or approximation may also be used to explain a particular embodiment.

For example, a component of HD2 that is introduced by the body voltage modulation of the feedback resistor 642 may be reduced or eliminated by adjusting an output of the reference voltage circuit 602 to have a value $V'_{ref}$:

$$V'_{ref} = V_{ref}\left(1 - \frac{vcoef1 * vout}{2}\right), \quad \text{(Eq. 9)}$$

where Vcoef1 corresponds to a first order coefficient of a change in resistance of the feedback resistor 642 responsive to a voltage across the feedback resistor 642. The output of the reference voltage circuit 602 may be adjusted to have the value in Equation 9 by configuring the bias circuit 294 so that Ratio has a value that is based on a sum of the first resistance and the second resistance (e.g., R1+R2) as compared to the second resistance. Ratio may have a value that is constant with respect to Vout and that is given by:

$$\text{Ratio} = \frac{R1 + R2}{2 * R2}. \quad \text{(Eq. 10)}$$

For example, in an implementation where the resistance R2 of the feedback resistor 292 equals the resistance R1 of the bias resistor 612 and equals the resistance Rf1 of the feedback resistor 642, setting Ratio to have a value of 1 (based on Equation 5) reduces HD2. In this implementation, the body terminal 326 of the feedback resistor 292 may be directly coupled to the output 208 of the amplifier 290 and the voltage divider 650 may be bypassed or omitted.

Biasing the body of the feedback resistor body provides the adjusted reference voltage $$V'_{ref}\left(\text{where } V'_{ref} = V_{ref}\left(1 - \frac{vcoef1 * vout}{2}\right)\right)$$

from Equation 9) having a value that is a function of Vout and Vcoef1, which will track over voltage, process and temperature (PVT) variations due to the negative feedback loop. Thus, the implementation of FIG. 6 may provide improved amplifier HD2 over ranges of PVT variations as compared to a system that instead applies a bias to the reference voltage Vref that is input to the DAC 624. Although applying a bias to Vref can generate the same value of $V'_{ref}$ to cancel HD2 at nominal conditions, implementing such a system to cancel HD2 over the full range of PVT variations may be prohibitively complex or expensive due to variations of Vcoef1.

By adjusting the bias applied to the body terminal 326 of the feedback resistor 292 based on the output of the amplifier 290, a voltage level of Vref is adjusted due to the effect of conductivity modulation of the feedback resistor 292 on the feedback path to the feedback input 606. Adjusting Vref corresponds to analog pre-distortion that may at least partially offset distortion introduced by conductivity modulation of the feedback resistor 642. As a result, distortion of Vout at the output 296 may be reduced.

Although FIG. 6 illustrates the reference voltage circuit 602 having a bandgap input, in other implementations the reference voltage circuit 602 may receive an input signal that does not correspond to a bandgap voltage. Although the DAC 624 is illustrated as a RDAC, in other implementations other DAC configurations may be included, such as a switched current source DAC or a switched capacitor DAC, as illustrative, non-limiting examples. Although the voltage divider 650 is illustrated as a resistor ladder, in other implementations the voltage divider 650 may include other voltage divider configurations.

Figure 7:
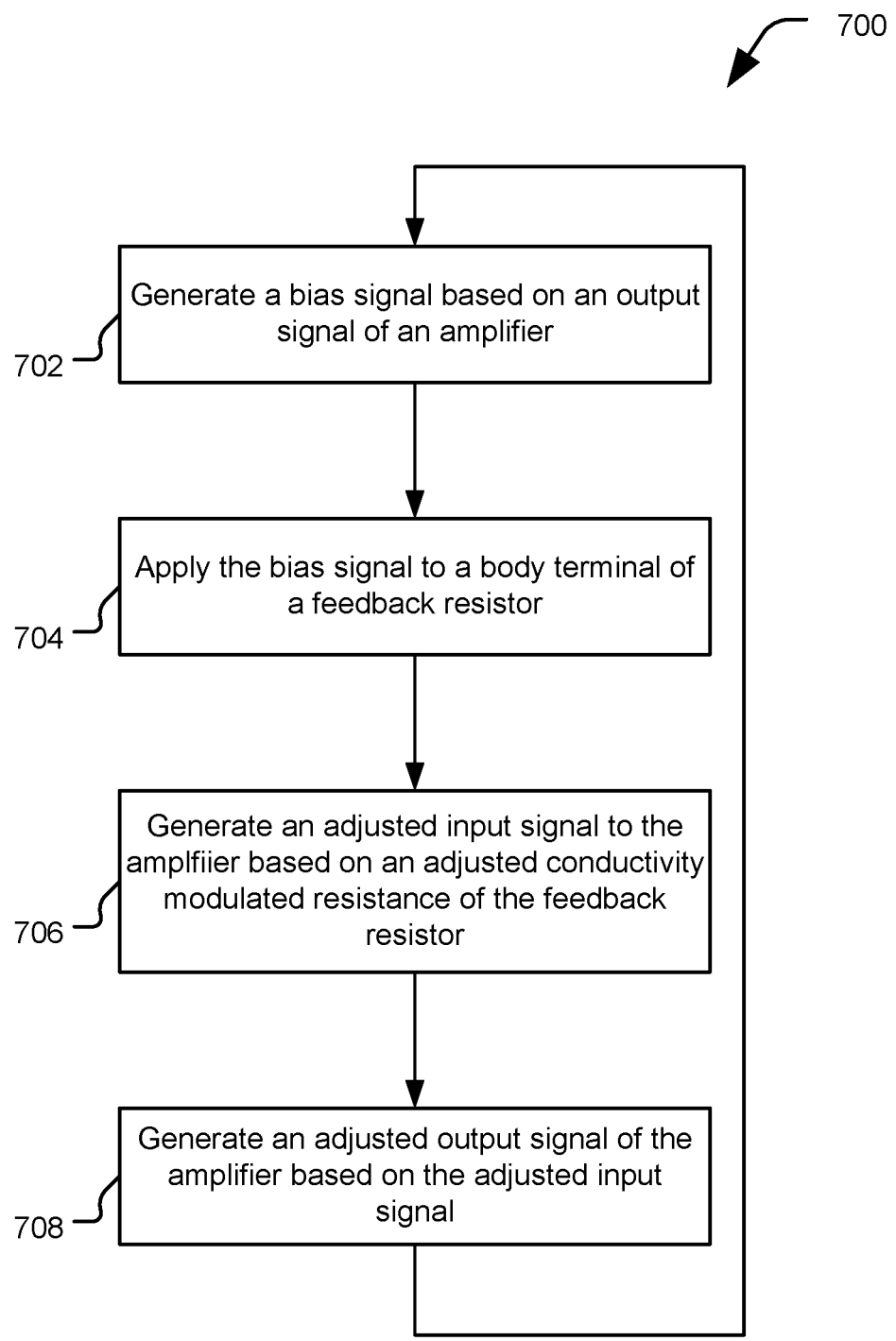
FIG. 7 illustrates a flowchart of a method that may be performed by the wireless device of FIG. 1.

Referring to FIG. 7, a particular exemplary embodiment of a method 700 of operating an amplifier is depicted. For example, the method 700 may be performed by the wireless device 110 of FIG. 1, such as by the audio amplifier 200 of FIG. 2, one or more of the amplifier circuits of FIGS. 3-6, or a combination thereof.

The method 700 includes generating a bias signal based on an output signal of an amplifier, at 702. The bias signal may be applied to a body terminal of a feedback resistor, at 704. Applying the bias signal to the body terminal of the feedback resistor may at least partially compensate for distortion in the output signal of the amplifier due to conductivity modulation of a feedback resistor.

For example, the bias signal may be generated by the bias circuit 294 of FIGS. 2-6. In the exemplary embodiments of FIGS. 3-5, the bias signal may correspond to Vbias1 328, Vbias2 332, or a combination thereof, applied to the body terminals 326, 330 of the feedback resistors 292, 316, respectively, to at least partially cancel nonlinearity due to conductivity modulation of the feedback resistors 292 and 316. In the exemplary embodiment of FIG. 6, the bias signal may correspond to Ratio*Vout and may be applied to the body terminal 326 of the feedback resistor 292 to generate Vref pre-distortion to at least partially offset distortion introduced by conductivity modulation of the feedback resistor 642.

An adjusted input signal to the amplifier may be generated based on an adjusted conductivity modulated resistance of the feedback resistor, at 706. For example, in the exemplary embodiments of FIGS. 3-5, the adjusted input signal may be generated at the input 308 via a voltage divider formed by the first feedback resistor 292 and the input resistor 304, at the input 310 via a voltage divider formed by the second feedback resistor 316 and the input resistor 306, or a combination thereof. As another example, in the exemplary embodiment of FIG. 6, the adjusted conductivity modulated resistance of the resistor 292 causes the reference voltage circuit 602 to adjust the reference voltage Vref to the DAC 624. Adjusting Vref causes the DAC 624 to adjust the input signal 202 to the amplifier 290.

An adjusted output signal of the amplifier may be generated based on the adjusted input signal, at 708. For example, the amplifier 290 of FIGS. 3-6 may generate an adjusted output signal at the output 208 responsive to adjustment of the input signal 202 at the first input 308, at the second input 310, or at both. The method 700 may return to 702, where an updated bias signal is generated based on the adjusted output signal.

Compensating for nonlinearity due to conductivity modulation distortion of resistors in an amplifier reduces distortion of the amplifier. For example, a second-harmonic distortion (HD2) of the amplifier may be reduced as compared to systems that do not compensate for nonlinearity. Reducing distortion in an amplifier output signal (e.g., a music signal provided by an audio amplifier) may enhance a user experience, such as by generating a high-quality music signal during audio playback.

In accordance with the above-described implementations, an apparatus includes means for amplifying an input signal. For example, the means for amplifying the input signal may include the amplifier 290 of FIGS. 2-6, one or more other amplifiers or other circuits configured to amplify a signal, or any combination thereof.

The apparatus includes means for resisting a first feedback current to a first input of the means for amplifying the input signal. For example, the means for resisting the first feedback current may include the resistor 292 of FIGS. 2-5, one or more other resistors or other circuit elements configured to provide a resistance, or any combination thereof.

The apparatus includes means for resisting a second feedback current to a second input of the means for amplifying the input signal. For example, the means for resisting the second feedback current may include the resistor 316 of FIGS. 3-5, one or more other resistors or other circuit elements configured to provide a resistance, or any combination thereof.

The apparatus includes means for providing a first body bias to the means for resisting the first feedback current. For example, the means for providing the first body bias may include the first body terminal 326 of FIGS. 3-5, such as a connector to a resistor well or a resistor shield, one or more other structures or circuit elements configured to provide a body bias, or any combination thereof.

The apparatus includes means for providing a second body bias to the means for resisting the second feedback current. For example, the means for providing the second body bias may include the second body terminal 330 of FIGS. 3-5, such as a connector to a resistor well or a resistor shield, one or more other structures or circuit elements configured to provide a body bias, or any combination thereof.

The means for providing the second body bias may be coupled to means for amplifying an output signal of the means for amplifying the input signal. For example, the means for amplifying an output signal of the means for amplifying may include the feedback amplifier 424 of FIGS. 4-5, the feedback amplifier 434 of FIGS. 4-5, one or more other amplifiers or other circuits configured to generate amplify an amplifier output signal, or any combination thereof.

The means for amplifying the output signal may include means for applying a negative gain to the output signal. For example, the means for applying the negative gain to the output signal may include the feedback amplifier 424 of FIGS. 4-5 configured to apply a negative gain, the feedback amplifier 434 of FIGS. 4-5 configured to apply a negative gain, one or more other amplifiers or other circuits configured to generate amplify an amplifier output signal, or any combination thereof.

Those of skill in the art would understand that information and signals may be represented using any of a variety of different technologies and techniques. For example, data, instructions, commands, information, signals, bits, symbols, and circuits that may be referenced throughout the above description may be represented by voltages, currents, electromagnetic waves, magnetic fields or particles, optical fields or particles, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a reference voltage circuit having a bandgap input and a reference voltage output;
   a digital-to-analog converter (DAC) coupled to the reference voltage output and having a digital signal input;
   an amplifier having a first input coupled to an output of the DAC, wherein the first input is coupled to an output of the amplifier via a feedback resistor; and
   a resistor coupled to the reference voltage output and having a body terminal coupled to the output of the amplifier.

2. The apparatus of claim 1, further comprising a resistor bank coupled to the output of the amplifier.

3. The apparatus of claim 2, wherein a bias voltage at an output of the resistor bank is a scaled version of a voltage at the output of the amplifier.

4. The apparatus of claim 3, further comprising a voltage divider including the resistor and a bias resistor, wherein the bias resistor has a first resistance and the resistor has a second resistance, and wherein a scaling factor corresponds to a ratio based on a sum of the first resistance and the second resistance as compared to the second resistance.

5. The apparatus of claim 1, further comprising a bias resistor coupled to a second input of the amplifier and to ground.

6. The apparatus of claim 1, wherein the reference voltage circuit comprises an amplifier having a feedback input coupled to an output of a voltage divider, and wherein the voltage divider is coupled to the reference voltage output.

7. The apparatus of claim 6, wherein the voltage divider includes the resistor and a bias resistor.

8. An apparatus comprising:
   means for generating a reference voltage based on a bandgap voltage;
   means for generating a differential signal based on the reference voltage;
   means for amplifying the differential signal, wherein the means for amplifying includes a first input coupled to an output of the means for generating the differential signal, and wherein the first input is coupled via a feedback resistor to an output of the means for amplifying the differential signal; and
   a resistor coupled to an output of the means for generating the reference voltage and having a body terminal coupled to the output of the means for amplifying.

9. The apparatus of claim 8, further comprising means for generating a bias voltage, wherein the means for generating the bias voltage has an input coupled to the output of the means for amplifying.

10. The apparatus of claim 9, wherein the bias voltage is a scaled version of a voltage at the output of the means for amplifying.

11. The apparatus of claim 10, further comprising a bias resistor coupled to the resistor, wherein the bias resistor has a first resistance and the resistor has a second resistance, and wherein a scaling factor corresponds to a ratio based on a sum of the first resistance and the second resistance as compared to the second resistance.

12. The apparatus of claim 8, further comprising a bias resistor coupled to a second input of the means for amplifying and to ground.

13. The apparatus of claim 8, wherein the means for generating the reference voltage comprises a second means for amplifying, wherein the second means for amplifying has a feedback input coupled to an output of means for voltage dividing, and wherein the means for voltage dividing is coupled to an output of the means for generating the reference voltage.

14. The apparatus of claim 13, wherein the means for voltage dividing includes the resistor and a bias resistor.

15. A method comprising:
   generating, at a reference voltage circuit, a reference voltage based on a bandgap voltage;
   generating a differential signal based on the reference voltage and a digital signal;
   amplifying the differential signal to generate an output voltage based on a feedback path that includes a feedback resistor; and
   applying a bias voltage to a body terminal of a resistor that is coupled to an output of the reference voltage circuit, wherein the bias voltage is based on the output voltage.

16. The method of claim 15, further comprising generating the bias voltage at a resistor bank.

17. The method of claim 15, wherein the bias voltage is a scaled version of the output voltage.

18. The method of claim 15, further comprising dividing the reference voltage at a voltage divider that includes the resistor.

19. The method of claim 18, further comprising providing a feedback signal from the voltage divider to the reference voltage circuit.

20. The method of claim 19, further comprising adjusting, at the reference voltage circuit, the reference voltage based on the feedback signal.

* * * * *